(12) United States Patent
Jeong (10) Patent No.: US 7,365,987 B2
(45) Date of Patent: Apr. 29, 2008

(54) STRUCTURE FOR HEAT DISSIPATION OF INTEGRATED CIRCUIT CHIP AND DISPLAY MODULE INCLUDING THE SAME

(75) Inventor: Kwang-Jin Jeong, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/338,648

(22) Filed: Jan. 25, 2006

(65) Prior Publication Data
US 2006/0187642 A1 Aug. 24, 2006

(30) Foreign Application Priority Data
Feb. 22, 2005 (KR) ............ 10-2005-0014506

(51) Int. Cl.
*H05K 7/20* (2006.01)
(52) U.S. Cl. ............................................ 361/719
(58) Field of Classification Search ............. 361/719, 361/679, 688, 690, 697
See application file for complete search history.

(56) References Cited

U.S. PATENT DOCUMENTS

| | | | |
|---|---|---|---|
| 4,520,541 A * | 6/1985 | Miki et al. .......... | 29/889.23 |
| 4,733,293 A * | 3/1988 | Gabuzda .............. | 257/697 |
| 5,597,034 A * | 1/1997 | Barker et al. ........ | 165/80.3 |
| 5,661,638 A * | 8/1997 | Mira .................... | 361/697 |
| 6,411,510 B2 * | 6/2002 | Sasa et al. ........... | 361/697 |
| 6,552,902 B2 * | 4/2003 | Cho et al. ............ | 361/704 |
| 6,666,261 B2 * | 12/2003 | Yang et al. ........... | 165/80.4 |
| 7,082,032 B1 * | 7/2006 | Barsun et al. ........ | 361/703 |

FOREIGN PATENT DOCUMENTS

KR  10-2002-0087885  11/2002

* cited by examiner

*Primary Examiner*—Javaid H. Nasri
(74) *Attorney, Agent, or Firm*—Lee & Morse, P.C.

(57) ABSTRACT

A circuit board having a first IC chip mounted thereon, and a first heat sink having a base portion disposed to contact a surface of the first IC chip and having a plurality of heat-dissipating fins, wherein the heat-dissipating fins extend away from the base portion and are inclined at an angle other than 90° from an imaginary horizontal plane.

20 Claims, 8 Drawing Sheets

STRUCTURE FOR HEAT DISSIPATION OF INTEGRATED CIRCUIT CHIP AND DISPLAY MODULE INCLUDING THE SAME

BACKGROUND OF THE INVENTION

1. Field of the Invention

The present invention relates to a structure for heat dissipation of an integrated circuit chip and a display module including the same. In particular, the present invention relates to a heat dissipating structure for an integrated circuit (IC) chip capable of effectively dissipating heat created by the chip to the outside, and a display module including the same.

2. Description of the Related Art

Plasma display modules are flat panel displays that use a discharge gas to display images. The technology enables the manufacture of low-profile screens, and allows for the formation of large-scale, high resolution displays with a wide viewing angle. Thus, interest in plasma display modules has grown.

Plasma display modules typically include two flat panels, or substrates, disposed to face each other and having discharge cells disposed between the two panels. After a discharge gas is injected into the cell, the cell is sealed, thereby forming the plasma display panel. A voltage is applied to electrodes traversing the discharge cell, inducing an emission of light from the gas in the discharging cell. In particular, the discharge gas produces ultraviolet rays, which excite phosphors to produce visible light, thus forming an image.

The voltage applied to the electrodes is controlled in response to a video signal received from a video source. The plasma display module may include one of more IC chips on a circuit board for driving the plasma display module. The IC chip may simultaneously control a large quantity of video signals, and may be subject to a heavy load, and therefore may generate a considerable amount of heat. An intelligent power module (IPM) can be used as the IC chip for a plasma display module. An IPM may generate more heat than in an ordinary IC chip, due to the design of the IPM's integrated circuit.

Figure 1:
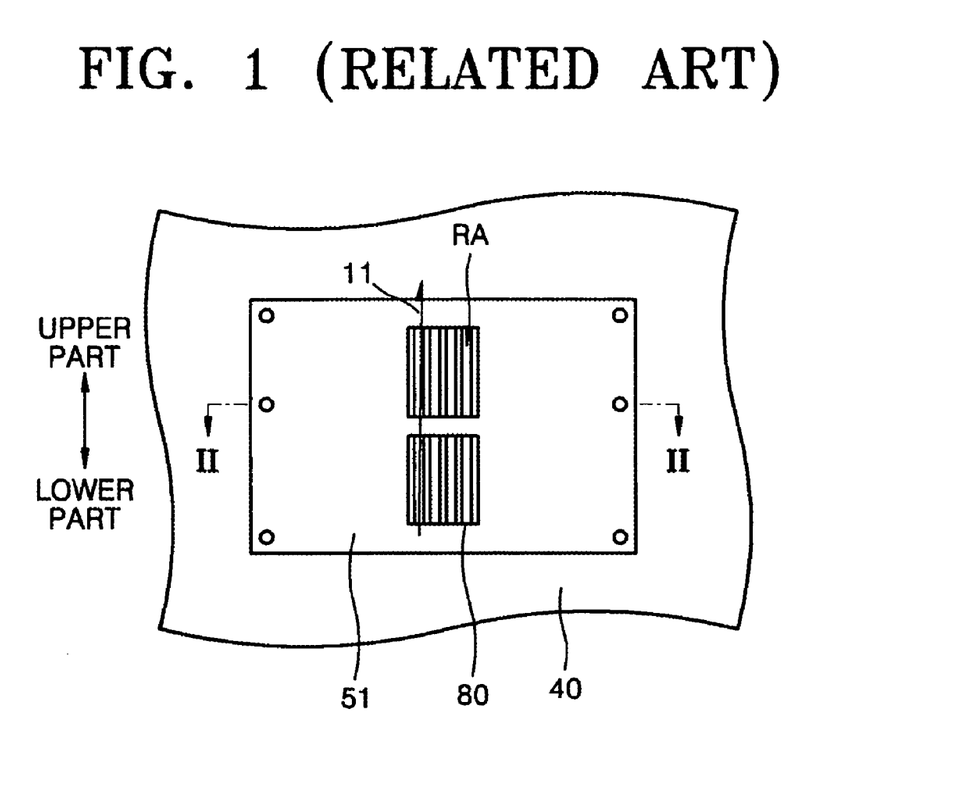
FIG. 1 illustrates a portion of a conventional plasma display module as seen from the rear.
Figure 2:
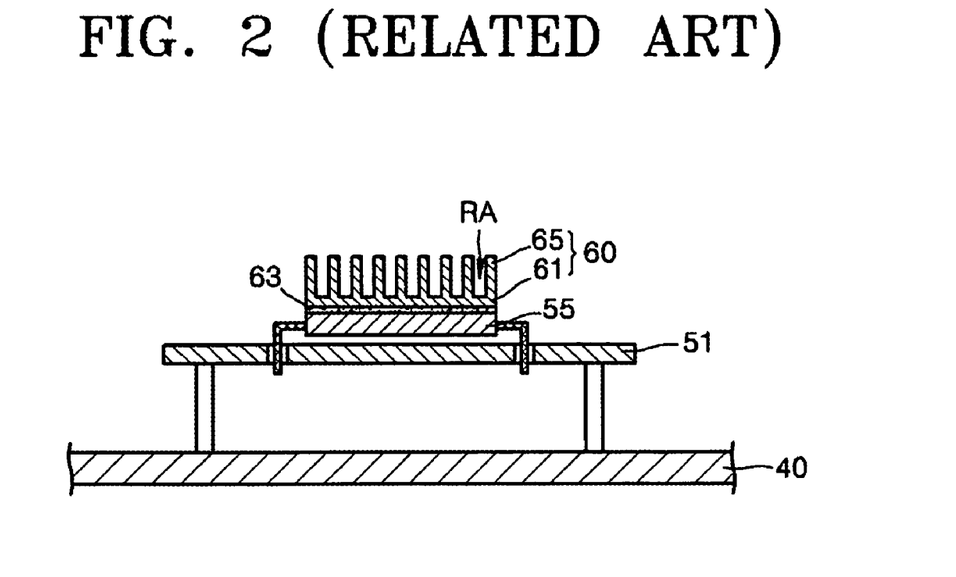
FIG. 2 illustrates a sectional view of FIG. 1 taken along line II-II.

Referring to FIGS. 1 and 2, plasma display modules may include one or more heat sinks 60 to dissipate heat from IC chips. The heat sink 60 may be attached to the rear of an IPM or other driving circuit chip 55 disposed on a circuit board 51 using, e.g., an adhesive 63. The heat sink 60 may include a base portion 61 and a plurality of heat-dissipating fins 65 extending from the base portion 61. The fins 65 may define a plurality of air passages RA between them.

Typically, as illustrated in FIGS. 1 and 2, a heat sink 60 in a plasma display module is oriented such that the fins 65 and the air passages RA between the fins 65 run in an upper to lower direction. That is, where the plasma display module is oriented in it's ordinary viewing position, with it's major viewing surface oriented perpendicular to the floor so as to be facing the viewer, the fins 65 of the heat sink 60 are oriented vertically, projecting horizontally from the base portion 61 with long edges of the fins 65 extending vertically, in an up-down orientation, such that the air passages RA extend upward between the fins 65. Accordingly, hot air 11 created by the IC chip rises in the air passages RA through convection, i.e., it flows in the air passages RA between the fins 65 from the lower part to the upper part in FIG. 1, thereby dissipating heat from the IC chip 55.

For a high-power IC chip 55, it may be necessary to provide a large heat sink 60. However, if the heat-dissipating fins 65 are extended in order to adequately cool the IC chip 55, the air passages RA are extended accordingly. In this case, the hot air 11 that received heat radiating from the lower portion of the IC chip 55 rises upward along the air passages RA that extend from the bottom to the top, getting hotter as it rises upward. As a result, the heat transfer from the top portion of the IC chip 55 may be diminished, and thus heat may not be dissipated effectively.

In addition, because a plasma display panel may have multiple IC chips 55 disposed in close proximity to one another, in the case where multiple chips arranged one above the other in a column, as illustrated in FIG. 1, the hot air 11 radiated from a lower IC chip 55 rises up through the heat sink 60 of the lower IC chip 55 to a heat sink 60 of an upper IC chip 55 directly above. Therefore, the upper IC chip 55 is cooled with the hot air 11 instead of cool air, such that it is less effective at dissipating its own heat.

SUMMARY OF THE INVENTION

The present invention is therefore directed to a heat dissipating structure for an integrated circuit (IC) chip capable of effectively dissipating heat created by the chip to the outside, and a display module including the same, which substantially overcomes one or more of the problems due to the limitations and disadvantages of the related art.

It is therefore a feature of an embodiment of the present invention to provide a structure for a heat sink of an IC chip, capable of effectively dissipating heat outward from the IC chip, especially heat emitted from the top portion of IC chip, and a display module including the same.

It is therefore another feature of an embodiment of the present invention to provide a structure for a heat sink of an IC chip, capable of preventing air heated by heat radiated from a lower IC chip from moving toward an upper IC chip, such that heat radiated from the upper IC chip may be more effectively dissipated to the outside.

At least one of the above and other features and advantages of the present invention may be realized by providing an integrated circuit (IC) apparatus including a circuit board having a first IC chip mounted thereon, and a first heat sink having a base portion disposed to contact a surface of the first IC chip and having a plurality of heat-dissipating fins, wherein the heat-dissipating fins extend away from the base portion and are inclined at an angle other than 90° from an imaginary horizontal plane.

Side surfaces of the plurality of heat-dissipating fins may define at least one air passage between them, such that air traversing the air passage by convection generally follows an imaginary line that is inclined at the angle. Side surfaces of the plurality of heat-dissipating fins may define a plurality of air passages between them, at least one air passage may open to a side edge of the heat sink, and at least one air passage may open to a bottom edge of the heat sink, such that air traversing the air passages by convection may enter the heat sink from the side edge and from the bottom edge.

The apparatus may further include an electronic element mounted on the circuit board, wherein the electronic element may be disposed above and proximate to the first IC chip, and may be disposed on the circuit board such that an extension of the imaginary line does not intersect the electronic element. The apparatus may further include an electronic element mounted on the circuit board, wherein the electronic element may be disposed below and proximate to the first IC chip, and may be disposed on the circuit board such that an extension of the imaginary line does not intersect the electronic element.

The apparatus may further include a second IC chip mounted on the circuit board, and a second heat sink disposed to contact a surface of the second IC chip and having a plurality of heat-dissipating fins, wherein the heat-dissipating fins extend away from the base portion and may be inclined at an angle other than 90° C. from an imaginary horizontal plane, and wherein the first and second heat sinks may be arranged such that corresponding sides of the first and second heat sinks are coplanar. The heat-dissipating fins of the second heat sink may be inclined in a direction opposite to that of the heat-dissipating fins of the first heat sink.

The apparatus may further include a second IC chip mounted on the circuit board below the first IC chip, and a second heat sink having a base portion disposed to contact a surface of the second IC chip and having a plurality of heat-dissipating fins, wherein the heat-dissipating fins extend away from the base portion and are inclined at the angle, and wherein the first IC chip may be offset from the second IC chip in one of a left and right direction, and air passages defined between the heat-dissipating fins of the second heat sink may be angled upward in the other of the left and right direction. The apparatus may further include a heat transferer interposed between the first IC chip and the first heat sink, the heat transferer transferring heat created by the first IC chip to the first heat sink. The circuit board may be disposed vertically.

At least one of the above and other features and advantages of the present invention may also be realized by providing a display module including a panel configured to produce an image, a chassis disposed at a rear of the panel, and a circuit portion installed at a rear of the chassis to drive the panel, the circuit portion including a circuit board having a first IC chip mounted thereon, and a first heat sink having a base portion disposed to contact a surface of the first IC chip and having a plurality of heat-dissipating fins, wherein the heat-dissipating fins extend away from the base portion and are inclined at an angle other than 90° from an imaginary horizontal plane.

Side surfaces of the plurality of heat-dissipating fins may define at least one air passage between them, such that air traversing the air passage by convection follows an imaginary line that is inclined at the angle.

The display module may further include an electronic element mounted on the circuit board, wherein the electronic element may be disposed above and proximate to the first IC chip, and may be disposed on the circuit board such that an extension of the imaginary line does not intersect the electronic element. The display module may further include an electronic component mounted on the circuit board, wherein the electronic element may be disposed below and proximate to the first IC chip, and may be disposed on the circuit board such that an extension of the imaginary line does not intersect the electronic element.

The display module may further include a second IC chip mounted on the circuit board, and a second heat sink disposed to contact a surface of the second IC chip and having a plurality of heat-dissipating fins, wherein the heat-dissipating fins extend away from the base portion and are inclined at an angle other than 90° from an imaginary horizontal plane, and wherein the first and second heat sinks may be arranged such that corresponding sides of the first and second heat sinks are coplanar. The heat-dissipating fins of the second heat sink may be inclined in a direction opposite to that of the heat-dissipating fins of the first heat sink.

The display module may further include a second IC chip mounted on the circuit board below the first IC chip, and a second heat sink having a base portion disposed to contact a surface of the second IC chip and having a plurality of heat-dissipating fins, wherein the heat-dissipating fins extend away from the base portion and are inclined at the angle, and wherein the first IC chip may be offset from the second IC chip in one of a left and right direction, and air passages defined between the heat-dissipating fins of the second heat sink may be angled upward in the other of the left and right direction. The display module may further include a heat transferer interposed between the first IC chip and the first heat sink, the heat transferer transferring heat created by the first IC chip to the first heat sink. The first IC chip may be an IPM (Intelligent Power Module). The panel may be a plasma display panel that uses plasma discharge to produce an image.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 10-2005-0014506, filed on Feb. 22, 2005, in the Korean Intellectual Property Office, and entitled, "Structure for Heat Dissipation of Integrated Circuit Chip and Display Module Including the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

According to the present invention, a structure for heat dissipation for a display module IC chip may allow heat radiated from a top portion of the IC chip to meet unheated air, so that the heat can be easily dissipated to the outside. Furthermore, by preventing air heated by heat radiated from a lower IC chip from moving toward an upper IC chip, heat radiated from the upper IC chip may be more effectively dissipated to the outside. Accordingly, the reliability of the IC chip may be increased, thereby improving the reliability of the display module itself, and, by maximally reducing the heat of the IC chip, the IC chip may not be subjected to heat damage and may exhibit a longer operational lifetime.

Figure 3:
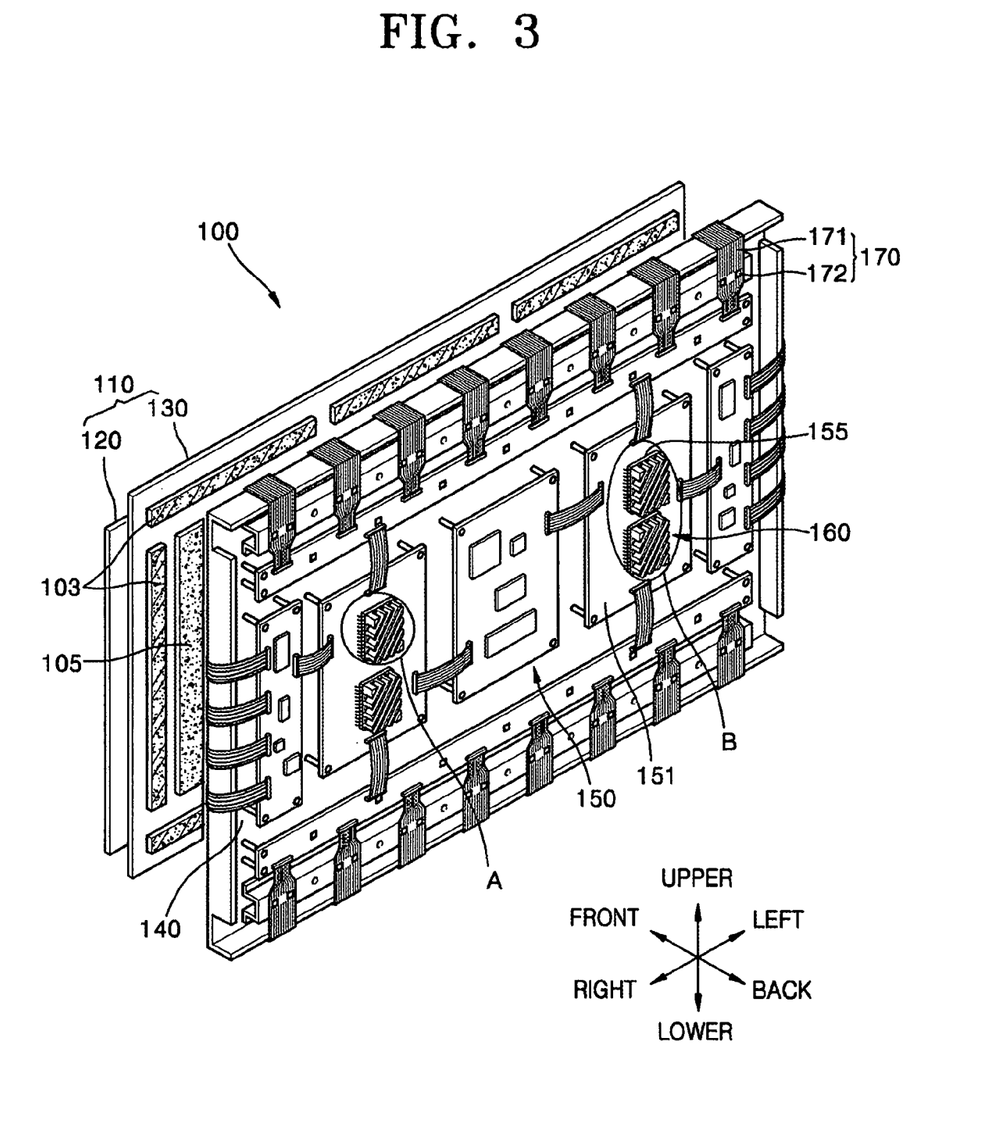
FIG. 3 illustrates an exploded perspective view of a display module according to an embodiment of the present invention.

FIG. 3 illustrates an exploded perspective view of a display module according to an embodiment of the present invention. Referring to FIG. 3, a display module 100 may include an image-producing panel 110, which may have a chassis 140 attached thereto at a rear portion of the panel 110 for supporting the panel 110.

In further detail, the chassis 140 may be disposed at the rear of the panel 110, and the panel 110 and the chassis 140 may be coupled together with, e.g., an adhesive 103 such as double-sided tape. A heat transferring medium 105, for transferring heat generated by the panel 110 to the chassis 140, may be incorporated between the panel 110 and the chassis 140.

Figure 4:
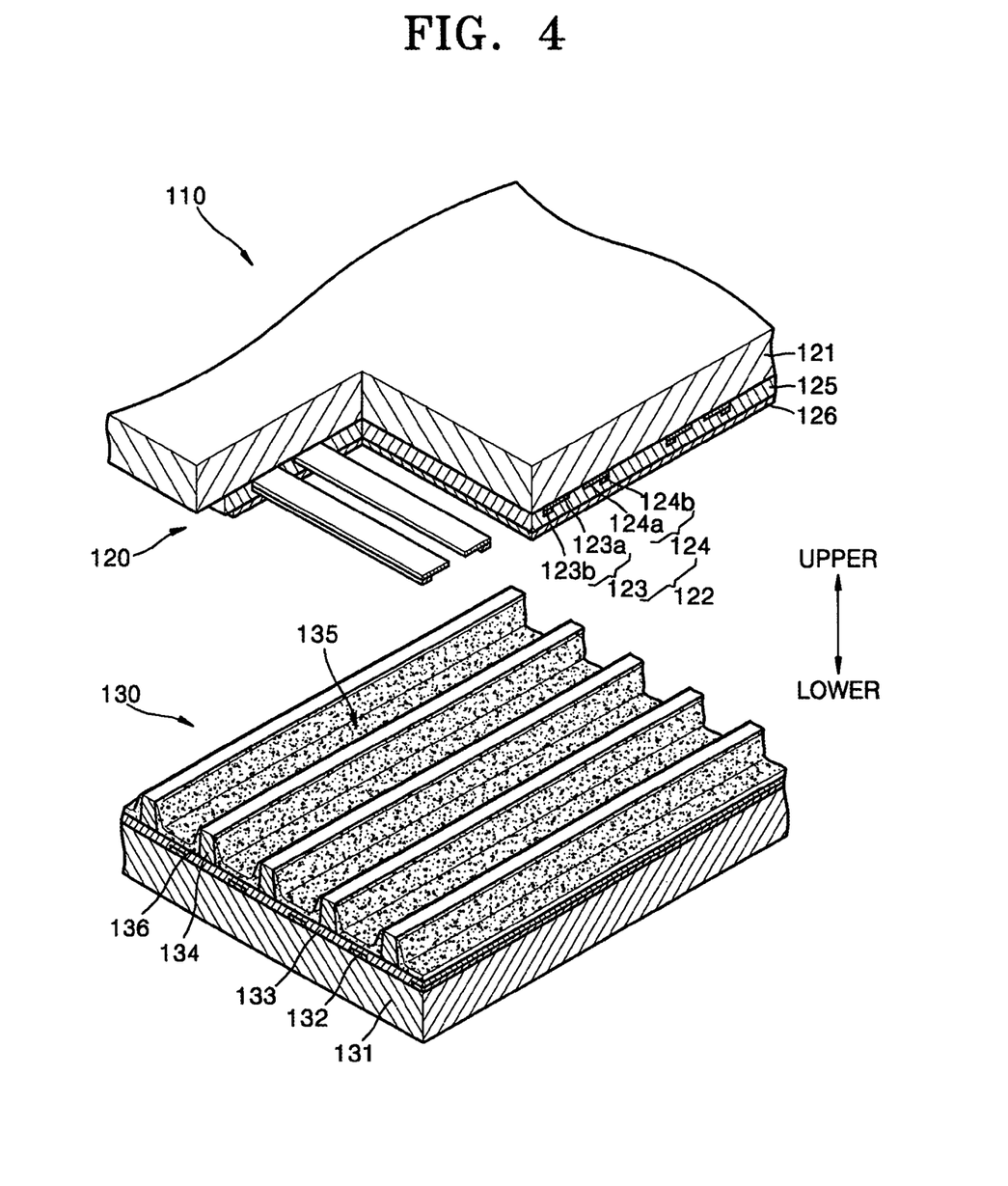
FIG. 4 illustrates an exploded perspective view of a panel portion of FIG. 3.

FIG. 4 illustrates an exploded perspective view of a panel portion of FIG. 3. The panel 110 may be one of various types of display panels, e.g., a plasma display panel (PDP). In particular, FIG. 4 illustrates an example of an alternating current-type PDP having a surface discharging 3-electrode structure, although the present invention is not limited to such a PDP. The panel 110 may include two opposing substrates, e.g., a front and rear panel 120 and 130, respectively.

In detail, the panel 110 may include the front panel 120, the rear panel 130 opposed to and coupled to the front panel 120, barrier ribs 134, sustain electrode pairs 122, address electrodes 132, and phosphor layers 136. In further detail, the front panel 120 may include a front substrate 121 and sustain electrode pairs 122 formed at the rear of the front substrate 121 and having an X and a Y electrode 123 and 124 for each discharging cell. The X and Y electrodes 123 and 124 forming a sustain electrode pair 122 may each operate with a common electrode and a scan electrode, and may be mutually separated by a discharging gap. The X electrode 123 may include an X transparent electrode 123a and an X bus electrode 123b in contact with the X transparent electrode 123a. Likewise, the Y electrode 124 may include a Y transparent electrode 124a and a Y bus electrode 124b in contact with the Y transparent electrode 124a.

The rear panel 130 may include a rear substrate 131 separated from and disposed to the rear of the front substrate 121 and defining a discharging area 135 between the rear substrate 131 and the front substrate 121. The rear panel 130 may also include address electrodes 132 disposed at the front of the rear substrate 131 and extending in directions crossing the sustain electrode pairs 122. A phosphor layer 136 may be formed in the discharging area 135.

The sustain electrode pairs 122 may be covered with a front dielectric layer 125, and the latter may have a protective layer 126 formed on its rear surface. The address electrodes 132 may be covered with a rear dielectric layer 133, and the latter may have barrier ribs 134 formed thereon.

Referring again to FIG. 3, the display module 100 may also include a circuit portion 150 that may include a plurality of circuit boards 151. The circuit portion 150 may transmit electrical signals to the panel 110 through a signal transmitter 170. The signal transmitter 170 may be, e.g., a flexible printed circuit (FPC), such as a tape carrier package (TCP) or a chip on film (COF). The signal transmitter 170 may be a package with at least one mounting device 172 mounted on a separate wire portion 171 in tape form.

The circuit portion 150 may be disposed at the rear of the chassis 140 and may include one or more circuit boards 151, e.g., logic boards, power boards, logic buffer boards, etc., for driving the panel 110. The circuit board 151 may be disposed vertically, e.g., in a plane parallel to the viewing surface of the display module 100. At least one IC chip 155 may be installed on the rear of the circuit board 151 and may be disposed between the circuit board 151 and a heat sink 160. The IC chip 155 may be, e.g., an IPM. The IPM may contain one or more switching elements, driving circuit elements, and basic protective circuits in one module, forming a highly integrated IC chip that may be activated by applying a current and a signal thereto. Due to the highly integrated nature of the IPM, it may become hotter than an ordinary IC chip. In order to dissipate this heat effectively, the heat sink 160 may be attached to a rear surface of the IPM, i.e., the back of the IPM, where the rear surface extends vertically.

A heat-dissipating structure for the IC chip 155 may include the IC chip 155 disposed on a circuit board 151 and having the heat sink 160. The heat sink 160 may be disposed to contact the rear of the IC chip 155 to dissipate heat generated by the IC chip 155.

Figure 5:
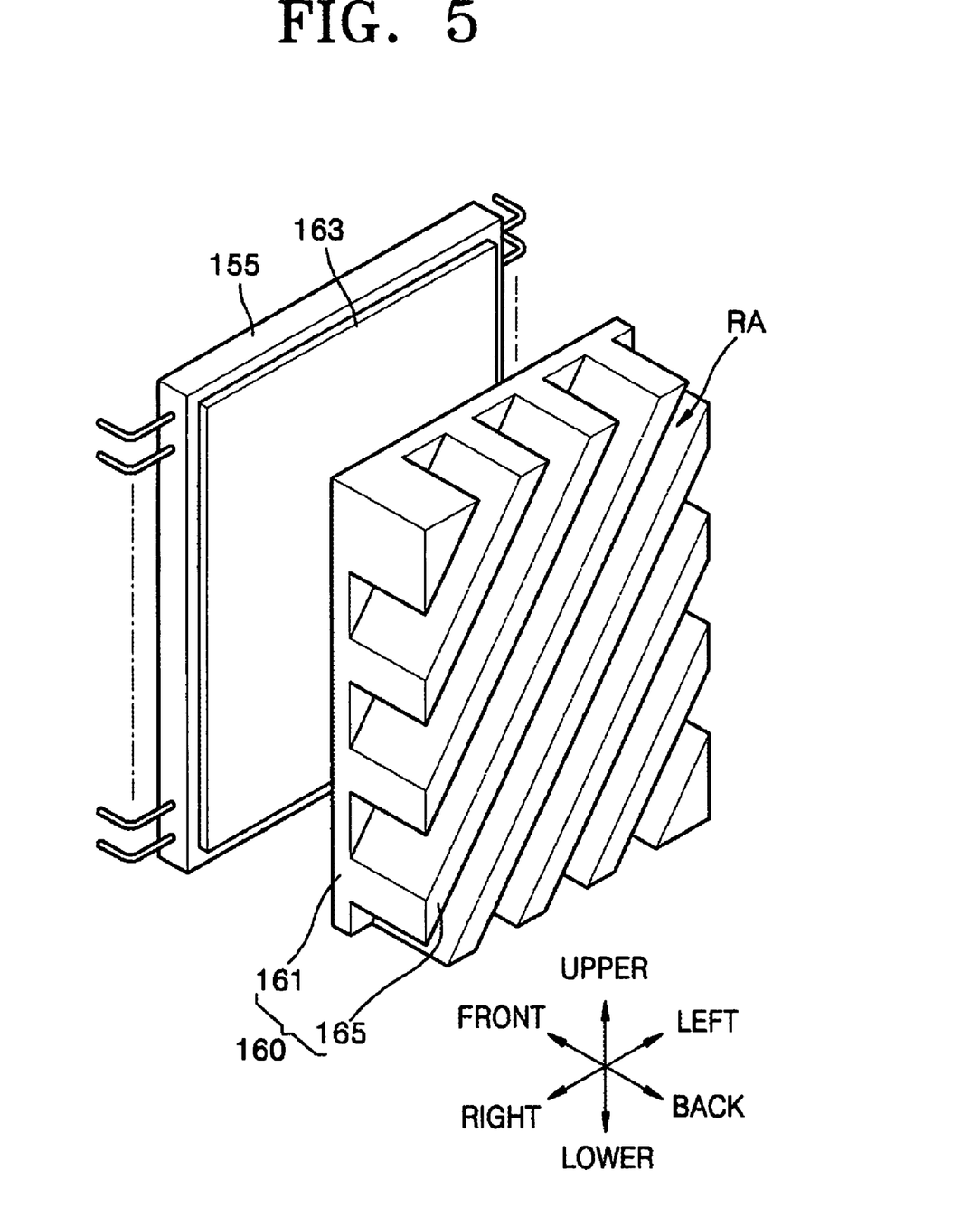
FIG. 5 illustrates an exploded perspective view of an integrated circuit chip portion of FIG. 3.

Referring to FIG. 5, the heat sink 160 may be formed with a base portion 161 and heat-dissipating fins 165. The base portion 161 of the heat sink may be installed to contact the rear of the IC chip 155, in order to transmit heat given off by the IC chip 155, and the heat-dissipating fins 165 may have a maximized surface area for dissipating the transferred heat to the outside.

The heat-dissipating fins 165 may protrude from the base portion 161. The heat-dissipating fins may be substantially linear and may be arranged in parallel. The heat-dissipating fins 165 may be arranged in parallel to each other at an angle other than 90° from an imaginary horizontal line at the base of the heat sink. That is, the heat-dissipating fins 165 may be offset from the vertical by a non-zero angle. Accordingly, heat from the top of the IC chip 155 may be effectively dissipated by the heat sink 160, as will be explained in greater detail below.

Figure 6:
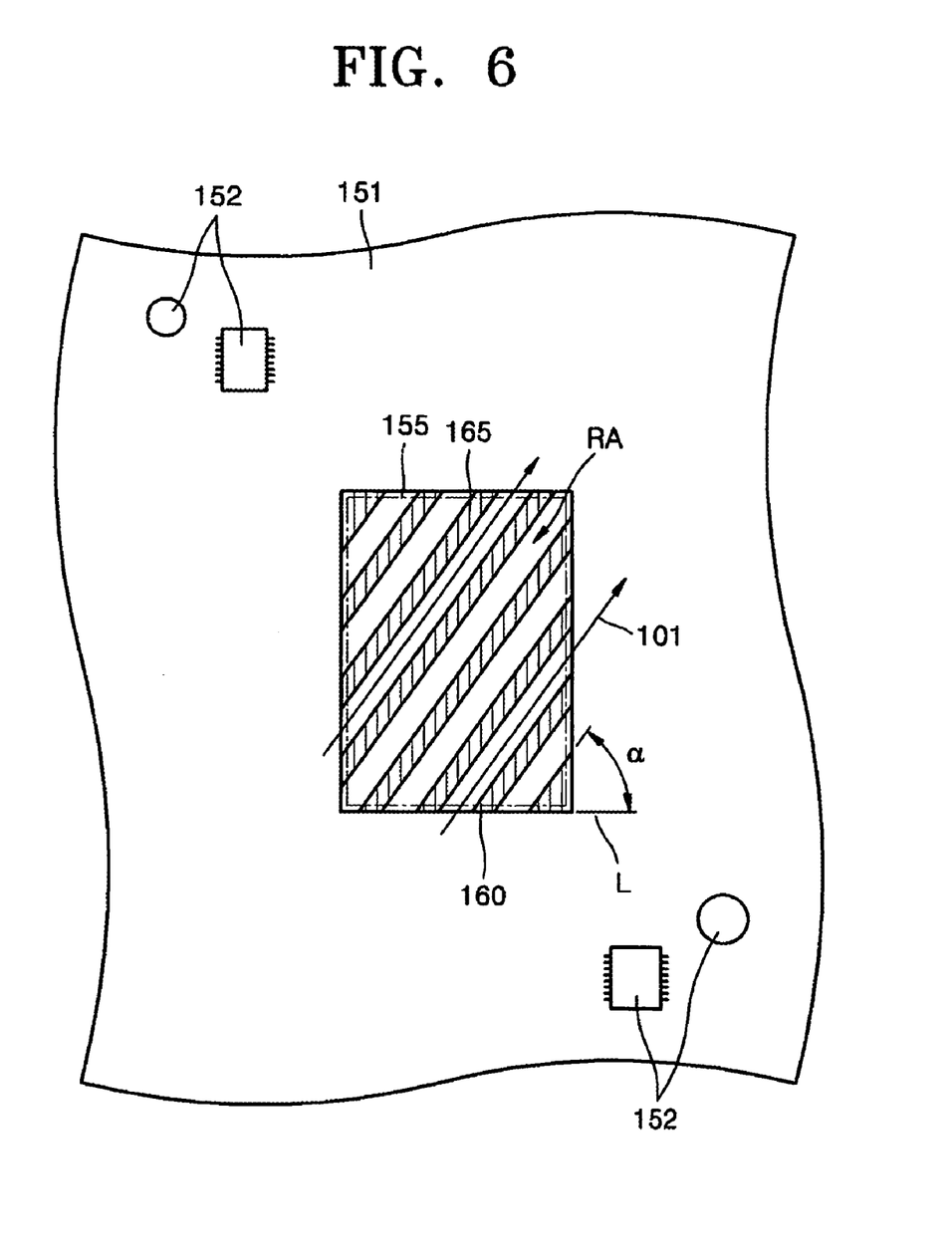
FIG. 6 illustrates an enlarged view of portion A of FIG. 3.

A heat-dissipating structure of the IC chip 155 and the heat sink 160 illustrated in FIG. 5 will be further explained with reference to the rear of the display module 100 (portion A of FIG. 3), as illustrated in FIG. 6. Referring to FIGS. 5 and 6, the circuit board 151 may be disposed at the rear of the chassis 140 (refer to FIG. 3), and the IC chip 155 may be spaced a predetermined distance from the rear of the circuit board 151. The heat sink 160 may be disposed on the side opposite to the circuit board, namely on the rear of the IC chip 155.

A heat transferer 163 may be interposed between the IC chip 155 and the heat sink 160. The heat transferer 163 may have a high heat transfer coefficient, for easily transferring heat emitted by the IC chip 155 to the heat sink, as well as elasticity. The heat transferer 163 may be a thermal sheet or thermal grease.

Referring to FIG. 6, the heat-dissipating fins 165 may be disposed in diagonal lines from top to bottom. In particular, a plurality of heat-dissipating fins 165 may extend in parallel to each other and may be arranged at an angle (α) from an imaginary horizontal line (L), where (α) is not 90°. That is, the heat-dissipating fins 165 may be arranged in a non-vertical orientation. Accordingly, the fins 165 may define a plurality of neighboring diagonal air passages RA, formed in the spaces between the heat-dissipating fins 165, which guide air 101 diagonally, i.e., along an imaginary line inclined at the angle (α), as the air rises upward by convection.

Consequently, entrances of the air passages RA of the heat-dissipating fins 165 may be disposed not only at the lower or bottom edge of the heat sink 160, but also at a side edge thereof. Accordingly, the air 101 rising toward the upper part of the IC chip 155 does not necessarily pass from the lower part of the IC chip 155, as it may enter at the side of the heat sink 160 from the outside. Therefore, the temperature of the air 101 rising to the upper part of the IC chip 155 may not be high, and thus it may effectively receive heat radiating from the top portion of the IC chip 155. Moreover, when IC chips 155 and heat sinks 160 so arranged are disposed one above another, the heat dissipation effects may be further improved, as will be discussed in greater detail below.

As shown in FIG. 6, one or more additional electronic elements 152, e.g., ICs, power supply components, etc., may be installed proximate to and above and/or below the IC chip 155. In FIG. 6, the additional elements 152 are not illustrated to scale, and may be smaller, the same size as, or larger than the IC chip 155. The additional elements 152 may be located on a region of the circuit board 151 other than a region that may be heated by air exiting the heat sink 160. Further, the additional elements 152 may be located on a region of the circuit board other than a region supplying air to the heat sink 160. That is, the additional elements 152 may be located so as not to coincide with imaginary extensions of the air passages RA, i.e., they are located so as not to be intersected by an imaginary line extended at the angle (α) from the air passages RA.

For example, the heat-dissipating fins 165 of the heat sink 160 on the IC chip 155 may be formed so that the air 101 rising from the air passages RA between the heat-dissipating fins 165 does not coincide with the additional elements 152. That is, where, as illustrated, the additional elements 152 are above and to the left of the IC chip 155, the heat-dissipating fins 165 may be arranged pointing to the right, e.g., at an angle (α) of less than 90°, such that the air 101 is directed away from the additional elements 152. Not only is heat given off by the additional elements 152 unable to be effectively dissipated to the outside if heated air 101 from the air passages RA contacts the additional elements 152, but the additional elements 152 may also suffer heat damage by being exposed to the hot air 101.

Figure 7:
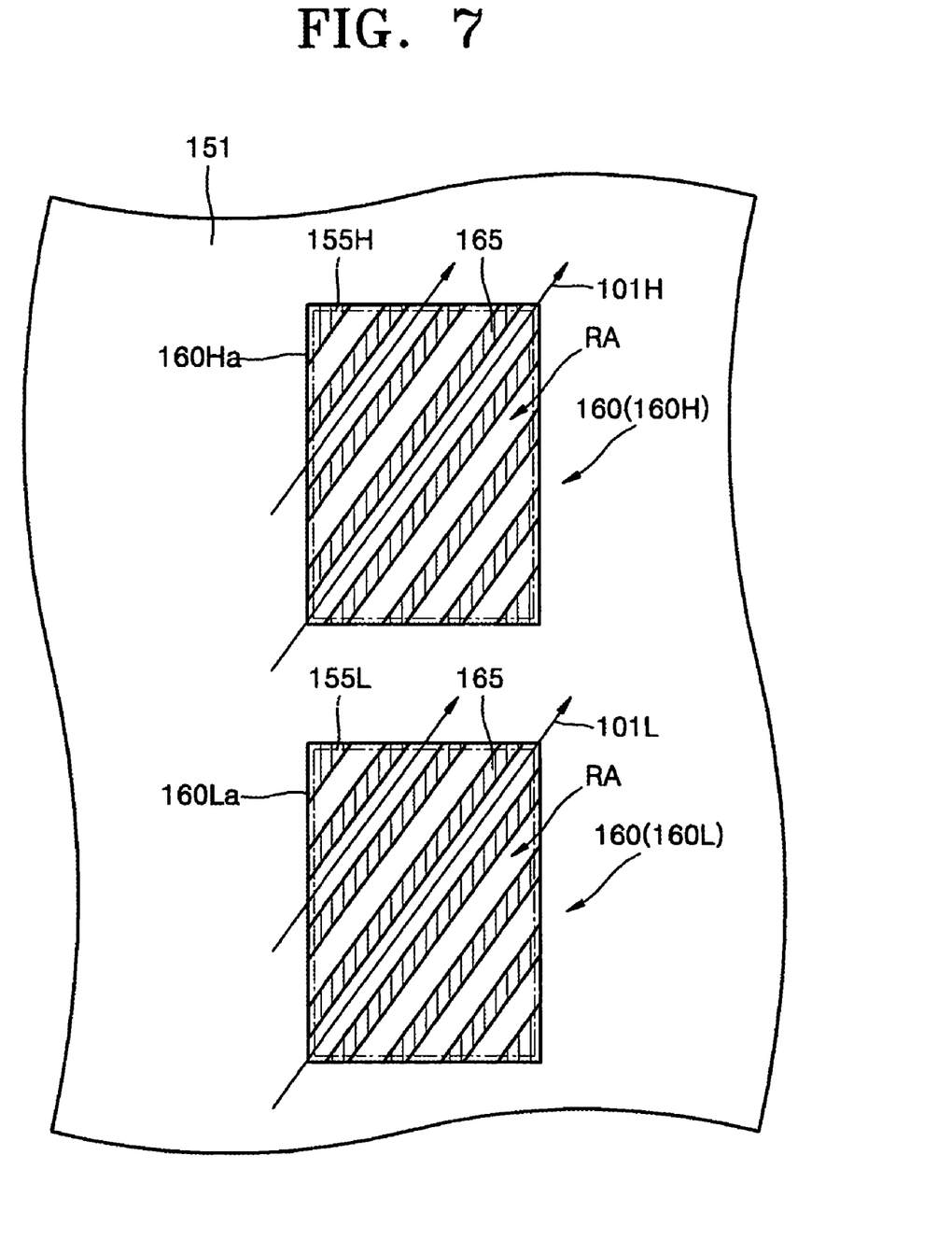
FIG. 7 illustrates an enlarged view of portion B of FIG. 3.

FIG. 7 illustrates an enlarged view of portion B of FIG. 3. Referring to FIG. 7 an additional electronic element in the form of an IC chip 155L may be installed below another IC chip 155H. The IC chips 155H, 155L may be disposed proximate to and above/below one another. Heat sinks 160H, 160L may be attached to rear surfaces of the IC chips 155H, 155L, respectively. The IC chips 155H, 155L and the heat sinks 160H, 160L may be arranged such that one side 160Ha of the heat sink 160H attached to the upper IC chip 155H is on the same vertical plane as one side 160La of the heat sink 160L attached to the lower IC chip 155L, i.e., such that corresponding sides 160Ha and 160La of the heat sinks 160H and 160L are coplanar. Accordingly, as the heat-dissipating fins 165 of the heat sink 160L may be disposed at an angle (α), the percentage of the heated air 101L that rises through the air passages of the heat sink 160L of the lower IC chip 155L toward the heat sink 160H of the upper IC chip 155H may be reduced. That is, a portion of the heated air 101L may exit the heat sink 160L at a side thereof, rather than exiting at the top thereof, and thus may not enter the heat sink 160H of the upper IC chip 155H. Therefore, the percentage of unheated air 101H moving through the air passages RA of the heat sink 160H of the upper IC chip 155H may be increased.

Figure 9:
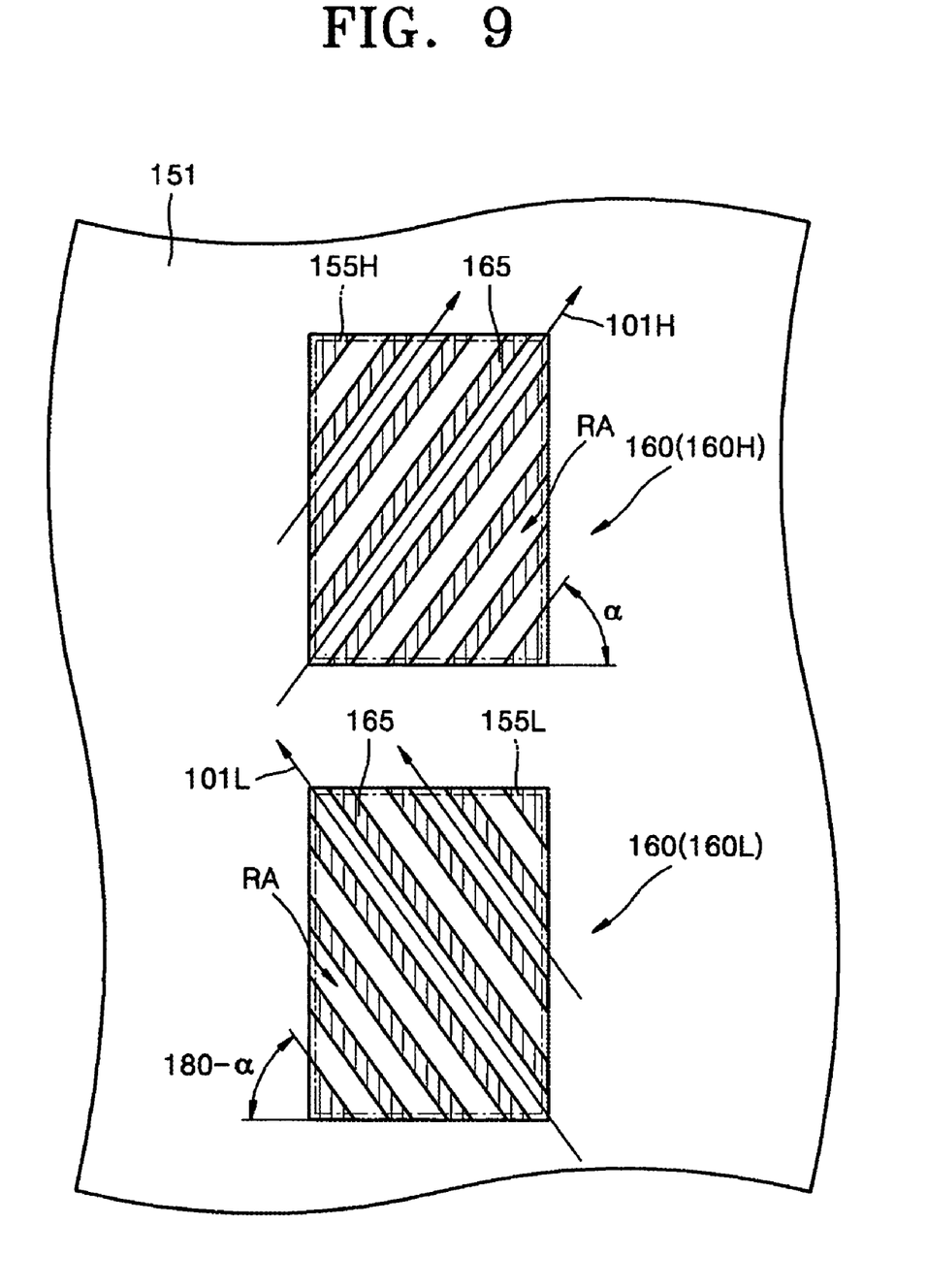
FIG. 9 illustrates another variation of FIG. 7.

In another implementation, illustrated in FIG. 9, IC chips 155H, 155L may have heat sinks 160H, 160L with oppositely-oriented heat-dissipating fins 165. That is, the heat-dissipating fins 165 of the heat sink 160H may be inclined in a direction opposite to that of the heat-dissipating fins 165 of the heat sink 160L. For example, the heat-dissipating fins 165 of the heat sink 160H may be inclined at an angle (α), and the heat dissipating fins 165 of the heat sink 160L may be inclined at an angle (180-α).

Figure 8:
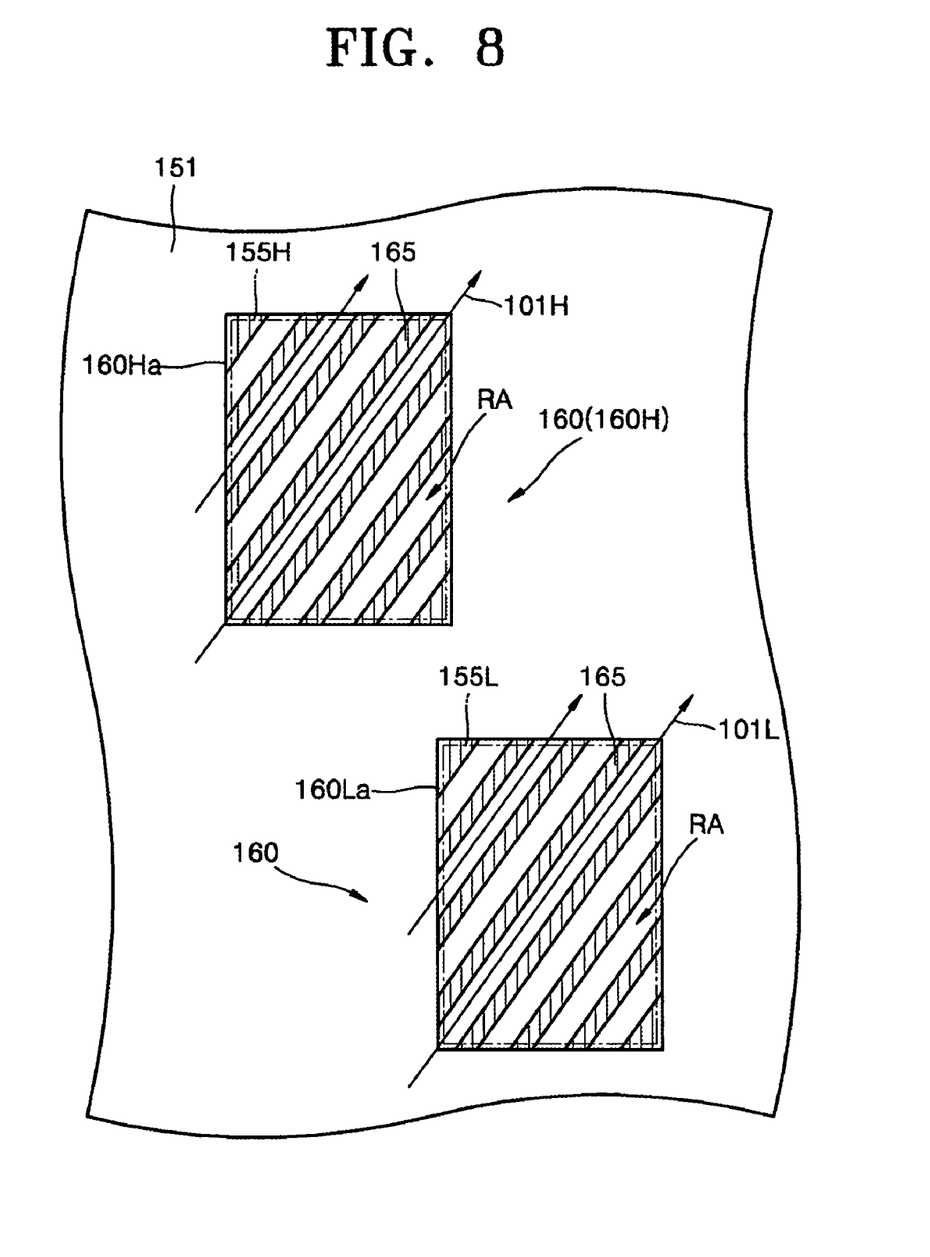
FIG. 8 illustrates a variation of FIG. 7.

FIG. 8 illustrates a variation of FIG. 7. Referring to FIG. 8, in order to prevent the heated air 101L, heated by the heat sink 160L of the lower IC chip 155L, moving towards the upper IC chip 155H, the lower IC chip 155L may be disposed in a direction opposite to that of the air passages RA between the heat-dissipating fins 165 of the upper IC chip 155H. That is, if the lower heat sink 160L has heat-dissipating fins 165 disposed at an angle (α) of less than 90° C., such that the air passages RA are defined from the lower left to the upper right of the heat sink 160L, then the upper IC chip 155H may be disposed to the left of the lower IC chip 155L. In other words, one side 160La of the heat sink 160L attached to the lower IC chip 155L may be disposed to the right of one side 160Ha of the heat sink 160H attached to the upper IC chip 155H. In contrast, it may not be desirable to have the lower IC chip 155L disposed to the left in such a way that the air passages RA of the lower heat sink 160L coincide with extended lines from the air passages RA of the upper heat sink 160H (not shown).

In a complementary example (not shown), if the air passages RA of the lower IC chip 155L heat sink 160L are angled from the lower right side to the upper left side, the lower IC chip 155L may be disposed to the left of the upper IC chip 155H. Thus, the percentage of heated air 101L from the lower IC chip 155L that moves toward the upper IC chip 155H may be reduced. In this case, it may not be desirable to have the lower IC chip 155L disposed to the right in such a way that the air passages RA of the lower heat sink 160L coincide with extended lines from the air passages RA of the upper heat sink 160H (not shown).

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An integrated circuit (IC) apparatus, comprising:
   a circuit board having a first IC chip mounted thereon; and
   a first heat sink having a first base portion disposed to contact a surface of the first IC chip and having a plurality of heat-dissipating fins, wherein all the heat-dissipating fins extend perpendicularly away from the first base portion and are inclined at an angle other than 90° with respect to a same plane defined by a side edge of the first base portion.

2. The apparatus as claimed in claim 1, wherein side surfaces of the plurality of heat-dissipating fins define at least one air passage between them, such that air traversing the air passage by convection generally follows an imaginary line that is inclined at the angle.

3. The apparatus as claimed in claim 2, wherein the side surfaces of the plurality of heat-dissipating fins define a plurality of air passages between them, at least one air passage opens to a side edge of the heat sink, and at least one air passage opens to a bottom edge of the heat sink, such that air traversing the air passages by convection can enter the heat sink from the side edge and from the bottom edge.

4. The apparatus as claimed in claim 2, further comprising an electronic element mounted on the circuit board, wherein the electronic element is disposed above and proximate to the first IC chip, and is disposed on the circuit board such that an extension of the imaginary line does not intersect the electronic element.

5. The apparatus as claimed in claim 2, further comprising an electronic element mounted on the circuit board, wherein the electronic element is disposed below and proximate to the first IC chip, and is disposed on the circuit board such that an extension of the imaginary line does not intersect the electronic element.

6. The apparatus as claimed in claim 1, further comprising:
 a second IC chip mounted on the circuit board; and
 a second heat sink having a second base portion disposed to contact a surface of the second IC chip and having a plurality of heat-dissipating fins, wherein the heat-dissipating fins extend away from the second base portion and are inclined at an angle other than 90° from an imaginary horizontal plane, and
 wherein the first and second heat sinks are arranged such that corresponding sides of the first and second heat sinks are coplanar.

7. The apparatus as claimed in claim 6, wherein the heat-dissipating fins of the second heat sink are inclined in a direction opposite to that of the heat-dissipating fins of the first heat sink.

8. The apparatus as claimed in claim 1, further comprising:
 a second IC chip mounted on the circuit board below the first IC chip; and
 a second heat sink having a second base portion disposed to contact a surface of the second IC chip and having a plurality of heat-dissipating fins, wherein the heat-dissipating fins extend away from the second base portion and are inclined at the angle, and
 wherein the first IC chip is offset from the second IC chip in one of a left and right direction, and air passages defined between the heat-dissipating fins of the second heat sink are angled upward in the other of the left and right direction.

9. The apparatus as claimed in claim 1, further comprising a heat transferer interposed between the first IC chip and the first heat sink, the heat transferer transferring heat created by the first IC chip to the first heat sink.

10. The apparatus as claimed in claim 1, wherein the circuit board is disposed vertically.

11. A display module, comprising:
 a panel configured to produce an image, a chassis disposed at a rear of the panel, and a circuit portion installed at a rear of the chassis to drive the panel, the circuit portion including:
 a circuit board having a first IC chip mounted thereon; and
 a first heat sink having a first base portion disposed to contact a surface of the first IC chip and having a plurality of heat-dissipating fins, wherein the heat-dissipating fins extend away from the first base portion and are inclined at an angle other than 90° from an imaginary horizontal plane, so that at least one heat dissipating fin is in contact with a vertical edge of the first base portion and a horizontal edge of the first base portion.

12. The display module as claimed in claim 11, wherein side surfaces of the plurality of heat-dissipating fins define at least one air passage between them, such that air traversing the air passage by convection follows an imaginary line that is inclined at the angle.

13. The display module as claimed in claim 12, further comprising an electronic element mounted on the circuit board, wherein the electronic element is disposed above and proximate to the first IC chip, and is disposed on the circuit board such that an extension of the imaginary line does not intersect the electronic element.

14. The display module as claimed in claim 12, further comprising an electronic element mounted on the circuit board, wherein the electronic element is disposed below and proximate to the first IC chip, and is disposed on the circuit board such that an extension of the imaginary line does not intersect the electronic element.

15. The display module as claimed in claim 11, further comprising:
 a second IC chip mounted on the circuit board; and
 a second heat sink having a second base portion disposed to contact a surface of the second IC chip and having a plurality of heat-dissipating fins, wherein the heat-dissipating fins extend away from the second base portion and are inclined at an angle other than 90° from an imaginary horizontal plane, and
 wherein the first and second heat sinks are arranged such that corresponding sides of the first and second heat sinks are coplanar.

16. The display module as claimed in claim 15, wherein the heat-dissipating fins of the second heat sink are inclined in a direction opposite to that of the heat-dissipating fins of the first heat sink.

17. The display module as claimed in claim 11, further comprising:
 a second IC chip mounted on the circuit board below the first IC chip; and
 a second heat sink having a second base portion disposed to contact a surface of the second IC chip and having a plurality of heat-dissipating fins, wherein the heat-dissipating fins extend away from the second base portion and are inclined at the angle, and
 wherein the first IC chip is offset from the second IC chip in one of a left and right direction, and air passages defined between the heat-dissipating fins of the second heat sink are angled upward in the other of the left and right direction.

18. The display module as claimed in claim 11, further comprising a heat transferer interposed between the first IC chip and the first heat sink, the heat transferer transferring heat created by the first IC chip to the first heat sink.

19. The display module as claimed in claim 11, wherein the first IC chip is an IPM (Intelligent Power Module).

20. The display module as claimed in claim 11, wherein the panel is a plasma display panel that uses plasma discharge to produce an image.

* * * * *